(12) United States Patent
Fan et al.

(10) Patent No.: US 12,289,833 B2
(45) Date of Patent: Apr. 29, 2025

(54) THREE DIMENSIONAL CIRCUIT MODULE AND METHOD FOR MANUFACTURING THE SAME

(71) Applicant: Silergy Semiconductor Technology (Hangzhou) LTD, Hangzhou (CN)

(72) Inventors: Gao Fan, Hangzhou (CN); Chen Zhao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 231 days.

(21) Appl. No.: 18/078,238

(22) Filed: Dec. 9, 2022

(65) Prior Publication Data

US 2023/0199962 A1    Jun. 22, 2023

(30) Foreign Application Priority Data

Dec. 21, 2021    (CN) .......................... 202111572498.5

(51) Int. Cl.
  *H05K 1/14*    (2006.01)
  *H05K 1/11*    (2006.01)
  *H05K 1/18*    (2006.01)
  *H05K 3/00*    (2006.01)

(52) U.S. Cl.
  CPC ............... *H05K 1/14* (2013.01); *H05K 1/115* (2013.01); *H05K 1/181* (2013.01); *H05K 3/0014* (2013.01); *H05K 2201/047* (2013.01); *H05K 2201/08* (2013.01)

(58) Field of Classification Search
  CPC .......... H05K 1/14; H05K 1/115; H05K 1/181; H05K 2201/047; H05K 2201/08
  See application file for complete search history.

(56) References Cited

U.S. PATENT DOCUMENTS

| | | | |
|---|---|---|---|
| 7,265,719 B1* | 9/2007 | Moosbrugger | H01Q 21/065 343/893 |
| 7,425,684 B2 | 9/2008 | Ta | |
| 7,768,280 B1* | 8/2010 | Wright | G01R 31/2889 324/754.08 |
| 8,253,031 B2 | 8/2012 | Chen et al. | |
| 8,967,000 B2* | 3/2015 | Pagani | G01L 1/005 73/862.68 |
| 10,629,574 B2* | 4/2020 | Bolognia | H01L 25/18 |
| 11,109,478 B2* | 8/2021 | Klenk | B62D 5/0406 |
| 11,375,617 B2* | 6/2022 | Chuah | H05K 3/4691 |
| 11,605,884 B2* | 3/2023 | Shimura | H01Q 21/065 |
| 2005/0073820 A1* | 4/2005 | Lim | H05K 7/1422 361/784 |
| 2005/0184372 A1 | 8/2005 | Asahi et al. | |

(Continued)

*Primary Examiner* — Hoa C Nguyen (57) ABSTRACT

A three dimensional circuit module can include: a plurality of PCBs located on different faces, where surfaces of the PCBs include circuit modules; a plurality of circuit assemblies connected through components; where the plurality of circuit assemblies comprises at least one first circuit assembly having a first main board and at least one first side board that are located on different faces, where the first main board and at least one first side board of the first circuit assembly are obtained by integrated curing molding process; and where the first main board of the first circuit assembly is located on one PCB board, and the first side board is located on an adjacent PCB board, in order to realize connection of adjacent PCBs.

10 Claims, 6 Drawing Sheets

(56) References Cited

U.S. PATENT DOCUMENTS

2015/0351233 A1* 12/2015 Peterson ............. H05K 1/0278
 361/785
2018/0103545 A1* 4/2018 Itakura .................... G09G 3/20
2019/0067151 A1* 2/2019 Chen ................. H01L 23/5387

* cited by examiner

THREE DIMENSIONAL CIRCUIT MODULE AND METHOD FOR MANUFACTURING THE SAME

RELATED APPLICATIONS

This application claims the benefit of Chinese Patent Application No. 202111572498.5, filed on Dec. 21, 2021, which is incorporated herein by reference in its entirety.

FIELD OF THE INVENTION

The present invention generally relates to the field of integrated circuits, and more particularly to three-dimensional circuit modules and associated manufacturing methods.

BACKGROUND

The current mainstream 3D circuit module is printed-circuit board (PCB). Electronic devices can be placed on its upper and lower surfaces to improve area utilization. With the functional expansion of electronic equipment, more and more circuit structures are required, corresponding to the need for larger PCBs. However, the improvement of PCB size consumes more area, which is not conducive to miniaturization of the equipment. By arranging a PCB on the side to lay out electronic components on the side, a three-dimensional circuit structure can be formed, and the effective surface area of the circuit increased, such that more components can be placed in the unit volume and that is conducive to improving the power density of the circuit. In some approaches, different PCBs can be spliced by soldering to realize the connection of different PCBs of 3D circuits, but the resistance of its solder joints is relatively large, which can result in reduced system efficiency.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

A three dimensional circuit module can include a plurality of printed-circuit boards (PCBs) and a plurality of circuit assemblies. The plurality of PCBs can be located on different faces, and the surfaces of the PCBs may be provided with circuit modules. The plurality of circuit assemblies can connect through components, where the plurality of circuit assemblies may include at least one first circuit assembly. The first circuit assembly can include a first main board and at least one first side board. The first main board and the at least one first side board can be located on different faces. The first main board and at the least one first side board of the first circuit assembly can be obtained by an integrated curing molding process. The first main board of the first circuit assembly can be located on one PCB board, and the first side board can be located on another adjacent PCB board, in order to realize connection of adjacent PCBs. When the PCB board is a multilayer board, the first circuit assembly can connect to one layer of the adjacent multilayer board. At least one remaining layer of the multilayer board can be electrically connected to the first circuit assembly through conductive holes. Also, the multilayer boards can be electrically connected through conductive holes.

Figure 1:
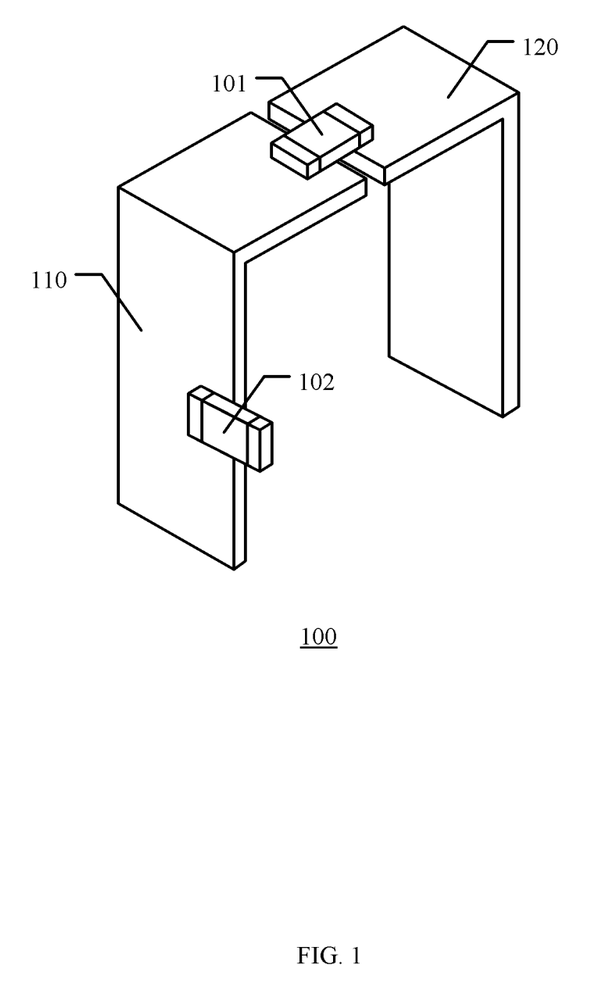
FIG. 1 is a partial structural diagram of a first example three-dimensional circuit module, in accordance with embodiments of the present invention.

Referring now to FIG. 1, shown a partial structural diagram of a first example three-dimensional circuit module, in accordance with embodiments of the present invention. Three-dimensional circuit module 100 can include circuit assemblies 110 and 120. Circuit assemblies 110 and 120 can each include at least one mounting surface to set component 101 on the mounting surface or between the mounting surfaces. Circuit assembly 110 can also connect with component 102 to connect electronic components 101 and 102, which may be located on different faces. For example, the components can include one or more of capacitors, inductors, resistors, and other electronic components.

In another example, circuit assemblies 110 and 120 can be coupled through a dielectric structure. For example, an insulating dielectric can be filled between circuit assemblies 110 and 120, in order to correspondingly obtain a capacitive structure. A magnetic dielectric can be filled between circuit assemblies 110 and 120, in order to correspondingly obtain a coupling inductance structure.

In one example, circuit assembly 110 can include a main board and at least one side board, and circuit assembly 120 can include a main board and at least one side board. The connection structure between the main board and the side board of circuit assemblies 110 and 120 can be a right angle bending structure, such that the main board and side board extend to different surfaces, and a part extending to the top surface can connect to component 101, in order to electrically connect component 101 with other components on other surfaces through circuit assembly 110. Component 102 can be arranged on the side surface of circuit assembly 110, and can connect with circuit assemblies 110 and 120 through component 101. The corresponding component 102 and the side structure of circuit component 120 may form a three-dimensional circuit module.

The material of the plurality of circuit assemblies can include at least one of metal material, magnetic material, and insulating material. When the material of the plurality of circuit assemblies includes magnetic material and insulating material, the subsequent process may also include electroplating conductor material on magnetic material and insulating material. Also, insulating isolation may be utilized between the conductor material and magnetic material, and between the conductor material and insulating material.

In one example, both circuit assemblies 110 and 120 can be integrated solidified molding structures. That is, their bending areas can be integrated solidified molding structures, which may directly form a stable three-dimensional structure, with guaranteed structural strength, uniform thickness, and material distribution. The connections between PCBs of different faces can be through the bending areas, without further welding, and may not bring additional solder resistance. This can reduce the welding loss caused by realization of three-dimensional circuit.

In another example, circuit assemblies 110 and 120 can be respectively extended to two surfaces, and respectively may include a side board connected to the main board. In yet another example, circuit assemblies 110 and 120 may include a plurality of side boards, which can be extended to three or more surfaces, and corresponding structures (e.g., wall corner structures, E-shaped structures, etc.). In one example, circuit assemblies 110 and 120 of the three-dimensional circuit module 100 can be extended to three surfaces. It can be understood that the particular circuit structure can include a plurality of circuit assemblies. The overall combined three-dimensional structure may correspond to the cubic structure. The total circuit assemblies can be extended on six surfaces as well, which can be applicable to a variety of particular requirements of circuit assemblies.

Each circuit assembly of the three-dimensional circuit module 100 can be integrated solidified molding through the mold, which can form a variety of bending structures with guaranteed curing performance. The three-dimensional circuit modules actually obtained may not be limited to cubes, but any suitable three-dimensional structures (e.g., curved structures including cylinders, spheres, etc.). According to particular circuit requirements, the three-dimensional circuit module can also include circuit assemblies that are flat (or smooth curved surface, etc.) on only one surface, which can be compatible with the manufacturing process of circuit assemblies of certain embodiments, and as such can be fabricated together.

Figure 2A:
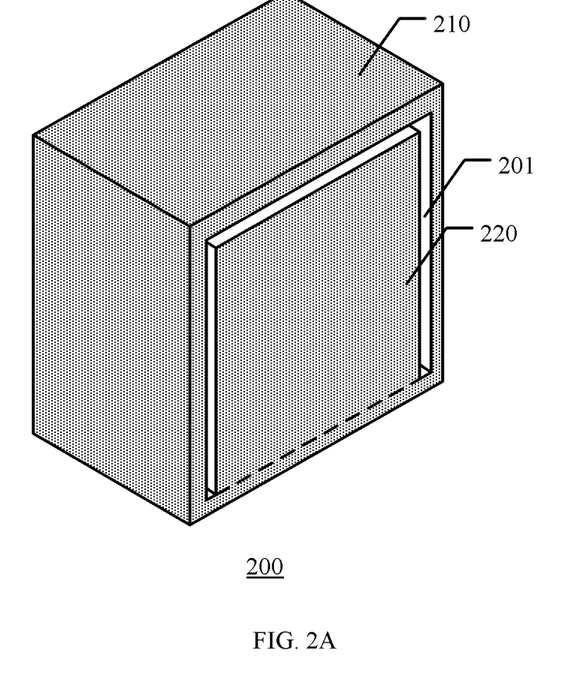
FIGS. 2A, 2B, and 2C are structural diagrams of carrier molds of the first example three-dimensional circuit module, in accordance with embodiments of the present invention.
Figure 2B:
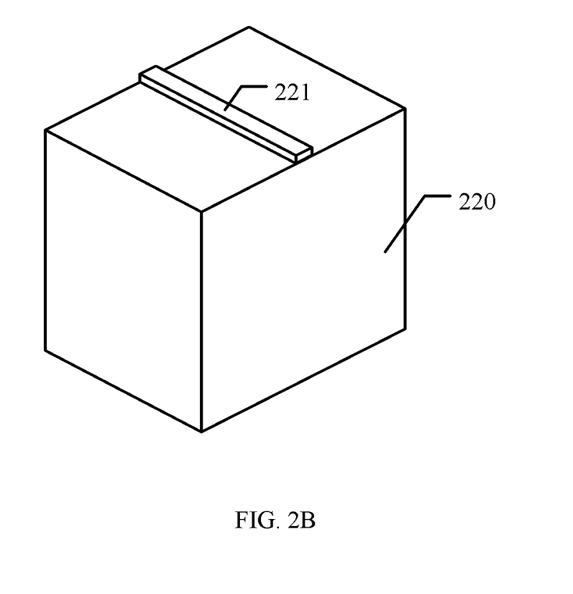
Figure 2C:
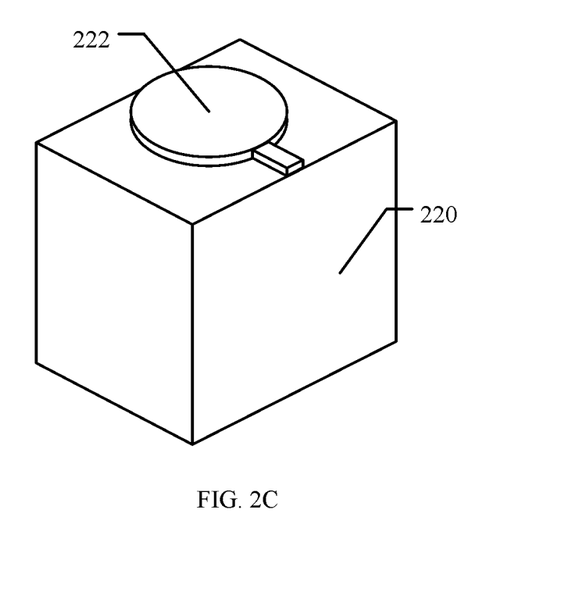

Referring now to FIGS. 2A, 2B, and 2C, shown are structural diagrams of carrier molds of the first example three-dimensional circuit module, in accordance with embodiments of the present invention. This example method can include providing a first mold that includes an outer shell, an inner core, and at least one crevice formed between the outer shell and the inner core. The crevice can include a first gap and at least one second gap. The first gap and the at least one second gap can be located on different extension surfaces. The method can also include filling the dielectric material into the at least one crevice.

After the dielectric material is solidified, the first mold can be removed in order to obtain a first circuit assembly, which can include a first main board and at least one first side board, whereby the first main board and the at least one first side board can be located on different surfaces. According to different dielectric materials, the first circuit assembly obtained can correspond to different circuit structures. For example, when the dielectric material is conductive material, the first circuit assembly obtained may be wire, capacitor plate, inductance, resistor, etc., for example. When the dielectric material is magnetic powder, the first circuit assembly obtained may be a magnetic core, etc., for example. When the dielectric material is an insulating material, the first circuit assembly obtained may be a circuit substrate, a dielectric layer, etc., for example. Also, the insulating material can be, e.g., silicone grease.

In particular embodiments, carrier mold 200 (the first mold) can include outer shell 210 and inner core 220. Inner core 220 can be placed in outer shell 210 to form crevice 201. By injecting flowing metal materials into crevice 201, the three-dimensional circuit module of integrated solidified molding can be obtained after metal materials are solidified. After molding, carrier mold 200 can be removed, and the molded three-dimensional circuit module can be separated. In one example, the required conductor structure can be formed by electroplating on the surface of carrier mold 200, and the conductor structure can be etched to remove the non-connected area to obtain the required circuit assembly.

Outer shell 210 or inner core 220 can be removed by an opening mold process, and part of the mold can be retained as molding supports for further operations, such as mechanical manufacturing and electrical insulation (e.g., laying insulating materials on the surface of non-connected areas, or laying insulating materials as a whole, and then removing part of the insulating materials according to the specific circuit requirements, exposing the underlying metal conductors).

In particular embodiments, the three segment gaps formed by crevice 201 may extend on three different surfaces, corresponding to the formation of circuit assembly structures on three different surfaces. For example, the morphology of each part of carrier mold 200 can be flexibly designed according to particular needs, in order to obtain the crevices with various morphologies, corresponding to the fabrication of circuit assemblies with various structures. For example, outer shell 210, inner core 220, and crevice 201 of carrier mold 200 can be obtained by printing, cutting, or engraving. For example, the conductor material can be copper, gold, silver, and/or other suitable metal conductive materials. According to the impedance requirements of the circuit assembly, the same or different kinds of flowing metal materials can also be injected into crevice by several times. Alternatively different kinds of flowing metal materials can be injected into the crevices of different partitions along the injection direction, in order to obtain circuit assemblies whose resistance changes in turn.

In particular embodiments, protruding structure 221 can be formed on an upper surface of inner core 220. The height of protruding structure 221 may be consistent with (e.g., the same as) the thickness of the crevice 201, and can be used to separate crevice 201, in order to obtain first and second crevices separated from each other. Circuit assemblies 110 and 120 can be obtained directly through the first and second crevices, respectively. The first crevice can include a continuous first and second gaps. The first and second gaps can be located on different extension surfaces, corresponding to forming the main board and side board of circuit assembly 110. The second crevice can include continuous third and fourth gaps. The third and fourth gaps can be located on different extension surfaces, corresponding to the main board and side board of circuit assembly 120. In one example, the protruding structure can also be fabricated on the inner surface of outer shell 210.

In one example, the difference between the height of protruding structure 221 and the thickness of crevice 201 may gradually change, corresponding to obtain a circuit assembly with gradual resistance change. In some applications, according to the shape of the circuit assemblies with specific requirements, a protruding structure with complementary patterns to the circuit assembly can be formed on the mold surface on both sides of the crevice, which may easily obtain multiple types of circuit assemblies. For example, as shown in FIG. 2C, the pattern of protruding structure 222 can be a combination of circular and linear patterns. In some applications, this can also include other types of patterns, which may be applied to a variety of circuit connection requirements.

In one example, the conductor mold can be formed first, and then the materials, such as flowing insulating material or magnetic powder, can be injected into the mold to form the required complex three-dimensional circuit module. For example, the manufacturing process of the three-dimensional circuit module in particular embodiments can also be used for the manufacturing of the three-dimensional circuit substrate, which can inject flowing insulating materials (e.g., silicone grease) or magnetic powder or other materials into the carrier mold, and then electroplate a layer of metal on the three-dimensional circuit substrate, in order to obtain the corresponding three-dimensional circuit module.

Figure 3A:
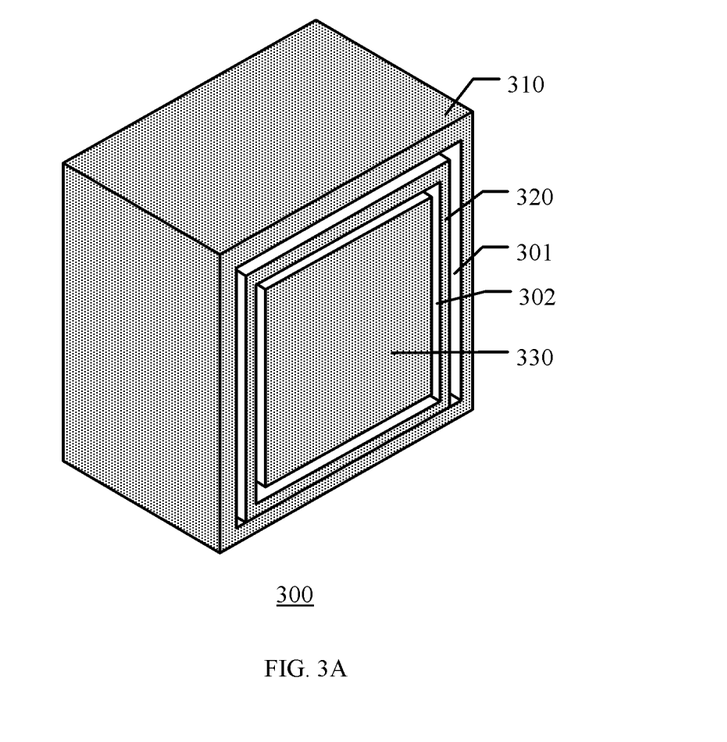
FIGS. 3A and 3B are structural diagrams of carrier molds of the first example three-dimensional circuit module, in accordance with embodiments of the present invention.
Figure 3B:
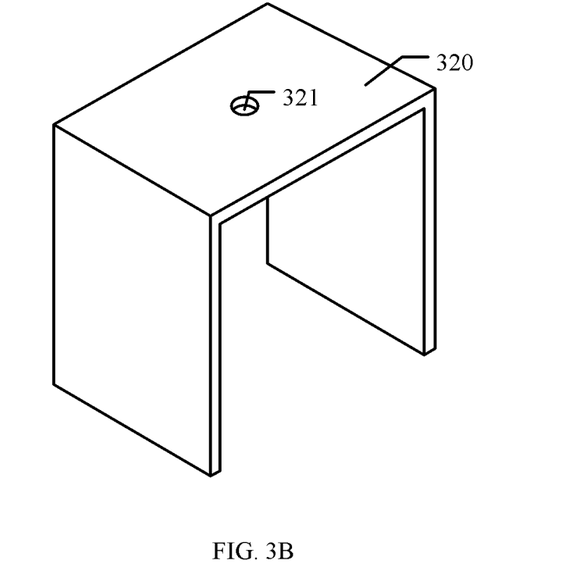

Referring now to FIGS. 3A and 3B, shown are structural diagrams of carrier molds of the first example three-dimensional circuit module, in accordance with embodiments of the present invention. In this particular example, carrier mold 300 can include outer shell 310, inner core wall 320, and inner core 330. Inner core wall 320 may be placed in outer shell 310. Inner core wall 320 can separate the crevice between inner core 330 and outer shell 310 into internal and external structures, in order to form crevices 301 and 302.

In particular embodiments, crevice 301 may extend to three surfaces, and crevice 302 may extend to four surfaces. Crevice 301 may surround three surfaces of crevice 302. Crevices 301 and 302 that are respectively located on the inner side and outer side of inner core wall 320 can connect through hole 321. The corresponding circuit components obtained can include two layers, and the two layers of circuit components can connect by way of through hole 321 on inner core wall 320, in order to form a three-dimensional circuit module with inner and outer layers.

Figure 4A:
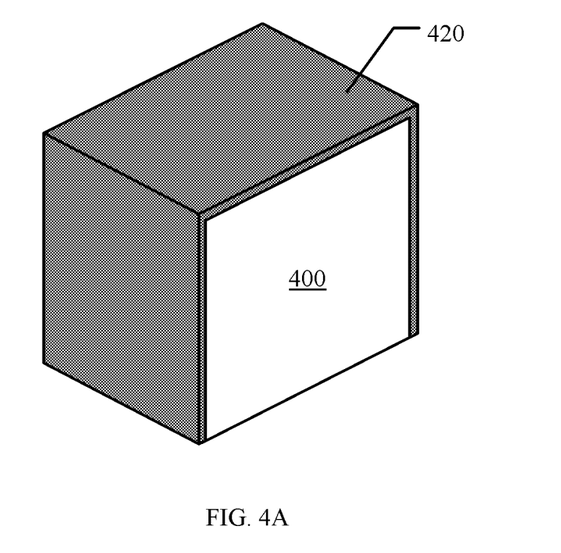
FIGS. 4A and 4B are structural diagrams of a manufacturing method for the first example three-dimensional circuit module, in accordance with embodiments of the present invention.
Figure 4B:
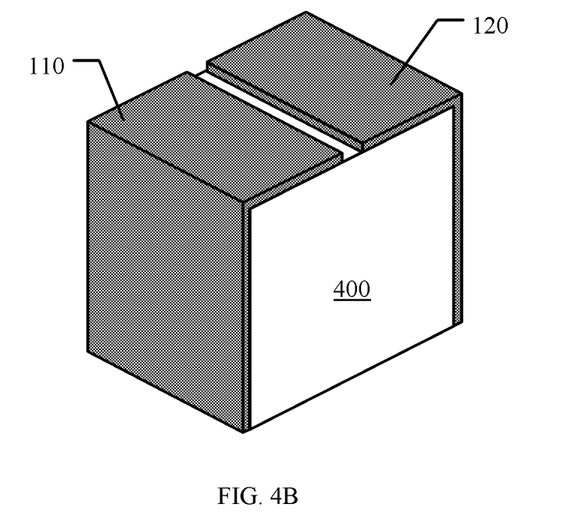

Referring now to FIGS. 4A and 4B, shown are structural diagrams of a manufacturing method for the first example three-dimensional circuit module, in accordance with embodiments of the present invention. In this particular example, the manufacturing method can include providing mold 400, depositing multi-layer metal on mold 400 (e.g., obtained by multiple deposition, or one layer of metal is deposited at a time, which can be specifically selected according to the total thickness demand and the process limit of the single deposition thickness), carrying out structural trimming and shaping treatment to the multi-layer metal (e.g., including the structural solidification of the circuit board, and the patterning of the circuit wiring), and obtaining circuit assemblies 110 and 120. For example, the specific operations of structure trimming and shaping treatment can include film pressing, exposure, development, etching, and film stripping in the traditional PCB manufacturing process. These can be compatible with a traditional two-dimensional PCB manufacturing process, and can accordingly be produced only by providing new molds.

A shaping area of circuit assembly 110 can correspond to first and second extension surfaces connected to the second mold. A plurality of second extension surfaces may be provided according to the number of side boards of the circuit assembly 110. A shaping area of circuit assembly 120 can correspond to third and fourth extension surfaces connected to the second mold. A plurality of fourth extension surfaces may be provided according to the number of side boards of circuit assembly 120, in order to obtain the second circuit assembly including multiple side plates. In another example, the shaping area of circuit assembly 120 may only include the third extension surface; that is, the second circuit assembly may only include the main board. For example, the number of the second circuit assembly and the structural dimensions of each second circuit assembly can be selected according to particular needs of the three-dimensional circuit module.

At least one of the first extension surface to the fourth extension surface can be a plane or a curved surface, which may be flexibly selected according to particular requirements. In certain embodiments, a layer of metal can be deposited on the surface of carrier mold 410 by a deposition process. Also, another layer of metal can be plated on the metal layer to obtain metal foil 420. Metal foil 420 can be subjected to the processes of film pressing, exposure, development, etching, and film stripping in the PCB manufacturing process, in order to form a patterned conductor surface, and to obtain circuit assemblies 110 and 120 as shown in FIG.

Figure 5:
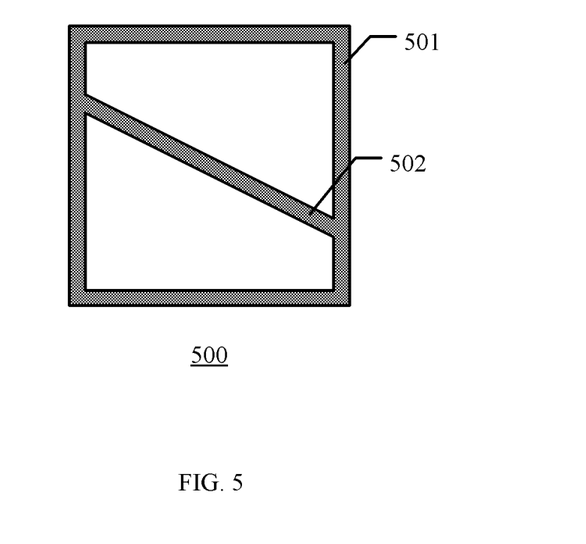
FIG. 5 is a partial structural diagram of a second example three-dimensional circuit module, in accordance with embodiments of the present invention.

Referring now to FIG. 5, shown is a partial structural diagram of a second example three-dimensional circuit module, in accordance with embodiments of the present invention. In this particular example three-dimensional circuit module 500, circuit assembly 502 can be made in the surrounding space of the circuit assembly 501 (e.g., the internal space corresponding to the overall three-dimensional structure of three-dimensional circuit module 500), and circuit assembly 502 can connect two opposite surfaces (e.g., connecting circuit assemblies on different layers, or directly connecting any two surfaces) at a relatively short distance. This can facilitate connection of three-dimensional circuit assemblies with lower line resistance, as well as improve the three-dimensional level of the three-dimensional circuit module 500 and increase the design flexibility of the three-dimensional circuit. With further reference to FIG. 2A, a third crevice can be arranged to penetrate inner core 220, and connect two crevices on the opposite side of inner core 220. Also, a solidified metal can be formed in each crevice, in order to obtain the structure of three-dimensional electrical circuit module 500 as shown in FIG. 5.

Figure 6:
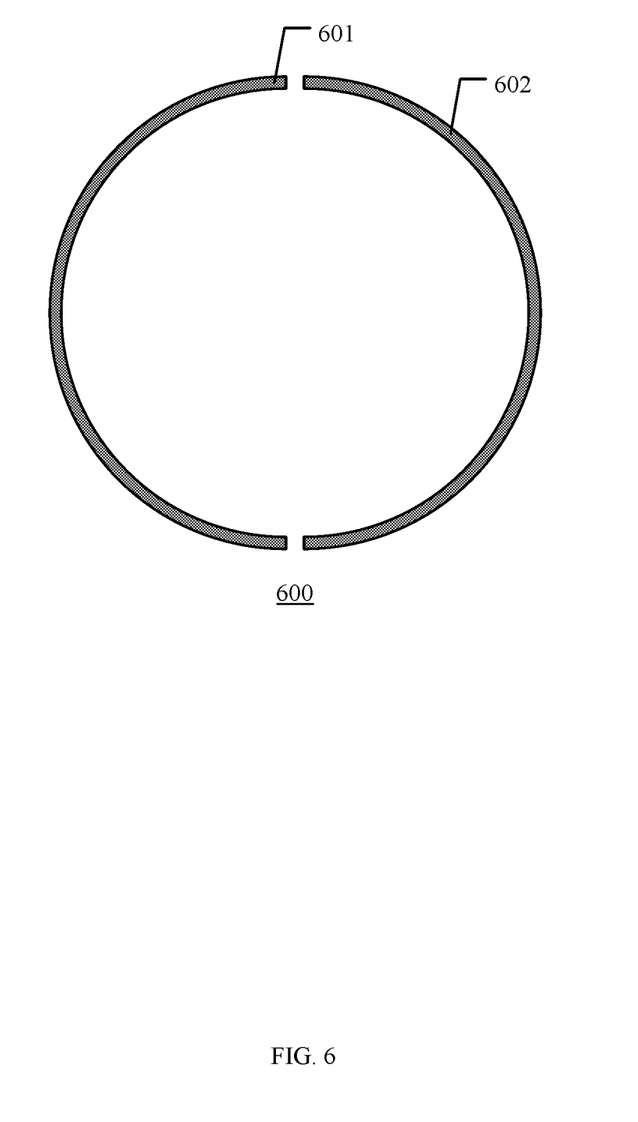
FIG. 6 is a partial structural diagram of a third example three-dimensional circuit module, in accordance with embodiments of the present invention.

Referring now to FIG. 6, shown is a partial structural diagram of a third example three-dimensional circuit module, in accordance with embodiments of the present invention. In this particular example, circuit assemblies 601 and 602 of three-dimensional circuit module 600 may be curved structures. This can make the surface perimeter of the circuit components connecting two places smaller under the same cross-sectional area, reduce the impedance of the circuit components connecting two places, and improve the electrical performance of the connection. Circuit assemblies with curved surface structure can be formed by injection molding or deposition molding on the mold, and their dimensions are relatively easy to control with guaranteed accuracy.

The circuit assemblies of the three-dimensional circuit module in particular embodiments can be made by carrier injection molding, or by an integrated forming structure formed after deposition on multiple surfaces (e.g., planes or curved surfaces) of the corresponding carrier mold. The bending area of the circuit assembly can be a curved surface structure or an angle structure, and the structural strength guaranteed. No bending may be required after forming, thus reducing damage to the structural strength of the circuit module that may be caused by bending, and improving the reliability of the three-dimensional circuit module. It can also support thinner thickness of circuit assemblies, which may facilitate further reduction of circuit structure size.

Moreover, a PCB substrate of other approaches can limit the curvature of the bending and may need to occupy considerable space, which is not conducive to the intensive integration of circuits. The three-dimensional circuit module particular embodiments can be directly solidified to form a bending structure of circuit assemblies, and its bending rate can be suitably designed to meet the requirements of high-density circuit integration.

The three-dimensional circuit module in particular embodiments can include a first circuit assembly that is integrally solidified. The first main board and at least one first side board of the first circuit assembly can be located on different extension surfaces. Through integrated solidification molding, the structural strength can be effectively guaranteed, and the structural reliability of the three-dimensional circuit module also guaranteed. In addition, the circuit connection of different surfaces may have no loss caused by additional solder resistance, which can improve circuit efficiency.

The manufacturing method of the three-dimensional circuit module of particular embodiments may provide a first mold that can include at least one crevice. The three-dimensional circuit module structure can be obtained by injecting flowing metal materials into the crevice of the first mold and curing molding. At least one crevice can include gaps extending on different surfaces, and the first circuit assembly of the three-dimensional circuit module can be obtained through the integrated curing molding. The first main board and the first side board of the first circuit component that extend on different surfaces can be integrated curing molding to ensure the structural strength of the bending area of the circuit assembly, thus ensuring the connection reliability of the three-dimensional circuit. Also, the circuit connection of different surfaces may not have the loss caused by the solder joint resistance of additional welding, which can effectively improve circuit efficiency.

Another manufacturing method of three-dimensional circuit module of particular embodiments may provide a second mold, which can deposit a metal layer on the surface of the first extension surface and the second extension surface of the second mold, and obtain the first circuit assembly extending on different surfaces by film pressing, exposure, development, etching, and film stripping processes of the metal layer. The first circuit assembly can be an integrated solidification molding structure, which may effectively guarantee the connection reliability of three-dimensional circuit module. Moreover, the loss caused by the solder joint resistance without additional welding in the circuit connection of different surfaces can effectively improve circuit efficiency.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A three dimensional circuit module, comprising:
   a) a plurality of printed-circuit boards (PCBs) located on different faces, wherein surfaces of the plurality of PCBs comprises circuit modules;
   b) a plurality of circuit assemblies connected through components;
   c) wherein the plurality of circuit assemblies comprises at least one first circuit assembly having a first main board and at least one first side board that are located on different faces, wherein the first main board and at least one first side board of the first circuit assembly are obtained by integrated curing molding process; and
   d) wherein the first main board of the first circuit assembly is located on one PCB board, and the first side board is located on an adjacent PCB board, in order to realize connection of adjacent PCBs.

2. The three dimensional circuit module of claim 1, wherein when the PCB board is a multilayer board, the first circuit assembly is connected to one layer of the adjacent multilayer board, and at least one remaining layer of the multilayer board is electrically connected to the first circuit assembly through conductive holes.

3. The three dimensional circuit module of claim 1, wherein the plurality of circuit assemblies further comprises at least one second circuit assembly having a second main board.

4. The three dimensional circuit module of claim 1, wherein a bending area between the first main board and the at least one first side board of the first circuit assembly comprises at least one of an arc structure and a corner structure.

5. The three dimensional circuit module of claim 1, wherein at least one of the plurality of circuit assemblies is configured to be a single layer board or a multilayer board.

6. The three dimensional circuit module of claim 1, wherein the plurality of circuit assemblies further comprises at least one third circuit assembly having at least two third main boards located at different layers and intermediate connectors connecting the at least two third main boards, and wherein at least two third main boards and intermediate connectors of the third circuit assembly are obtained by integrated curing molding process.

7. The three dimensional circuit module of claim 6, wherein a bending area between at least two third main boards and the intermediate connector of the third circuit assembly comprises at least one of an arc structure and a corner structure.

8. The three dimensional circuit module of claim 1, further comprising a dielectric structure filled between at least two adjacent circuit assemblies.

9. The three dimensional circuit module of claim 8, wherein the dielectric structure comprises at least one of a magnetic core and an insulating layer.

10. The three dimensional circuit module of claim 1, wherein the material of the plurality of circuit assemblies comprises at least one of metal material, magnetic material, and insulating material.

* * * * *